(12) United States Patent
Sim et al.

(10) Patent No.: US 8,947,275 B2
(45) Date of Patent: Feb. 3, 2015

(54) METHOD AND APPARATUS FOR CALIBRATING DIGITAL BACKGROUND THROUGH CAPACITOR DIVISION AND SWAPPING FOR REDUCING CAPACITOR MISMATCH EFFECT OF ANALOG-TO-DIGITAL CONVERTER

(71) Applicant: Postech Academy-Industry Foundation, Pohang-si, Gyeongsangbuk-do (KR)

(72) Inventors: Jae Yoon Sim, Pohang-si (KR); Hwa Suk Cho, Daejeon-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/185,950

(22) Filed: Feb. 21, 2014

(65) Prior Publication Data
US 2014/0232576 A1    Aug. 21, 2014

(30) Foreign Application Priority Data
Feb. 21, 2013   (KR) .................. 10-2013-0018365

(51) Int. Cl.
*H03M 1/06*   (2006.01)
*H03M 1/00*   (2006.01)

(52) U.S. Cl.
CPC ............ *H03M 1/0609* (2013.01); *H03M 1/002* (2013.01)

USPC ........... 341/118; 341/120; 341/122; 341/125; 341/130

(58) Field of Classification Search
CPC ....... H03M 1/10; H03M 1/145; H03M 1/164; H03M 1/468; H03M 1/804; H03M 1/1004; H03M 1/1033; H03M 1/1061; H03M 1/1019; H03M 1/1014; H03M 1/1215
USPC .................................................. 341/110–155
See application file for complete search history.

(56) References Cited

U.S. PATENT DOCUMENTS

| | | | |
|---|---|---|---|
| 7,035,756 B2 * | 4/2006 | Maloberti et al. ............ | 702/126 |
| 7,107,175 B2 * | 9/2006 | Maloberti et al. ............ | 702/126 |
| 7,199,746 B1 * | 4/2007 | Chowdhury et al. ......... | 341/172 |
| 7,227,479 B1 * | 6/2007 | Chen et al. .................... | 341/118 |
| 7,746,262 B2 * | 6/2010 | Chowdhury et al. ......... | 341/163 |
| 8,031,092 B1 * | 10/2011 | Sun .............................. | 341/120 |
| 8,111,178 B2 * | 2/2012 | Liao et al. ..................... | 341/120 |
| 8,390,489 B2 * | 3/2013 | Sun et al. ...................... | 341/120 |
| 8,446,304 B2 * | 5/2013 | Scanlan ........................ | 341/120 |

* cited by examiner

*Primary Examiner* — Lam T Mai
(74) *Attorney, Agent, or Firm* — Kile Park Reed & Houtteman PLLC

(57) ABSTRACT

A high-quality Analog to Digital Converter (ADC) is used to calibrate a difference attributable to a capacitor mismatch in a Digital to Analog Converter (DAC). The present invention is advantageous in that it can fabricate a low-power high-resolution ADC by calibrating an error attributable to a capacitor mismatch through a digital background calibration apparatus and method using a Successive Approximation Register (SAR).

13 Claims, 19 Drawing Sheets

| mode | C2 | C1 | C0 | D13-1 | D13-2 | D12-1 | D12-2 | D11-1 | D11-2 | D10 | D9 |
|------|----|----|----|-------|-------|-------|-------|-------|-------|-----|-----|
| 0 | 0 | 0 | 0 | D13 | D13 | D12 | D12 | D11 | D11 | D10 | D9 |
| 1 | 0 | 0 | 1 | D13 | D13 | D12 | D12 | D11 | D11 | D10 | D9 |
| 2 | 0 | 1 | 0 | D12 | D13 | D13 | D13 | D11 | D11 | D10 | D9 |
| 3 | 0 | 1 | 1 | D13 | D12 | D13 | D13 | D11 | D11 | D10 | D9 |
| 4 | 1 | 0 | 0 | D13 | D13 | D11 | D12 | D12 | D12 | D10 | D9 |
| 5 | 1 | 0 | 1 | D13 | D13 | D12 | D11 | D12 | D12 | D10 | D9 |
| 6 | 1 | 1 | 0 | D13 | D13 | D12 | D12 | D10 | D11 | D11 | D9 |
| 7 | 1 | 1 | 1 | D13 | D13 | D12 | D12 | D11 | D10 | D11 | D9 |

$$\Delta_{2n-2} + \Delta_{2n-3} + \Delta_{2n-4} + \ldots + \Delta_2 + \Delta_{1B} + \Delta_{1A} = 0$$

Effective Unit capacitor = $(2^{n-1}+1)C / 2^{n-1}C$ $\Delta_{1B} = \Delta_{1A} = 1C / (2n-1)C$
$\Delta_i (i \neq 2n-2) = 2^{n-1} \times \Delta_{1A}$ $\Delta_{2n-2} = -(\Delta_{2n-3} + \Delta_{2n-4} + \ldots + \Delta_2 + \Delta_{1B} + \Delta_{1A}) = -½$

FIG. 19

DREG : Dispersed REG
N = number of divided capacitor
X = number of bit (resolution)

| Dispersion weight | REG (MSB) | REG ($2^{nd}$ MSB) | REG ($3^{rd}$ MSB) | ... | REG ($n^{th}$ MSB) | Total |
|---|---|---|---|---|---|---|
| DREG (MSB) | 1 | 0 | 0 | | 0 | REG(MSB) |
| DREG ($2^{nd}$ MSB) | -1/2 | 1 | 0 | | 0 | REG($2^{nd}$ MSB) - ½ REG(MSB) |
| DREG ($3^{rd}$ MSB) | -1/4 | -1/2 | 1 | | 0 | REG($3^{rd}$ MSB) - ½ REG($2^{nd}$ MSB) - ¼ REG(MSB) |
| ... | ... | ... | ... | ... | ... | ... |
| DREG ($n^{th}$ MSB) | $-(1/2)^{n-1}$ | $-(1/2)^{n-2}$ | $-(1/2)^{n-3}$ | | 1 | REG($n^{th}$ MSB) - ½ REG($n$-$1^{th}$ MSB) - ... - $(1/2)^{n-1}$ REG(MSB) |
| DREG ($n+1^{th}$ MSB) | $-(1/2)^{n-2}$ | $-(1/2)^{n-3}$ | $-(1/2)^{n-4}$ | | -1/2 | - ½ REG($n^{th}$ MSB) - ¼ REG($n$-$1^{th}$ MSB) - ... - $(1/2)^{n}$ REG(MSB) |
| DREG ($n+2^{th}$ MSB) | $-(1/2)^{n-3}$ | $-(1/2)^{n-4}$ | $-(1/2)^{n-5}$ | | -1/4 | ½ DREG($n+1^{th}$ MSB) |
| ... | ... | ... | ... | ... | ... | ... |
| DREG(LSB+1) | $-(1/2)^{x-2}$ | $-(1/2)^{x-3}$ | $-(1/2)^{x-4}$ | | $-(1/2)^{x-n-1}$ | ½ DREG(LSB+2) |
| DREG(LSB) | $-(1/2)^{x-2}$ | $-(1/2)^{x-3}$ | $-(1/2)^{x-4}$ | | $-(1/2)^{x-n-1}$ | ½ DREG(LSB+1) |

METHOD AND APPARATUS FOR CALIBRATING DIGITAL BACKGROUND THROUGH CAPACITOR DIVISION AND SWAPPING FOR REDUCING CAPACITOR MISMATCH EFFECT OF ANALOG-TO-DIGITAL CONVERTER

BACKGROUND OF THE INVENTION

1. Field of the Invention

The present invention relates to an Analog to Digital Converter (ADC), and more particularly, to a digital background calibration method and apparatus for calibrating a difference attributable to a capacitor mismatch in a Digital to Analog Converter (DAC).

2. Description of the Related Art

In general, an ADC is a circuit for converting an analog signal into a digital signal and is one of core blocks that are necessary in all the signal processing fields as well as in the wireless communication field.

In particular, in the case of application fields, such as portable devices and wireless sensor networks in which a battery is used as a power supply source and thus available energy is very limited, it is necessary to minimize power consumption by lowering a supply voltage.

An ADC that is most advantageous in minimizing power consumption is advantageous in term of low power because it does not consume great power because of its Successive Approximation Register (SAR) structure, but is disadvantageous in that it uses a larger capacitor than that of other ADCs.

In general, in order to increase resolution of 1 bit, capacitance of a twice large capacitor is necessary. If the size of a capacitor is increased, an area occupied by the capacitor is increased and power consumption is also increased. Furthermore, there is a problem in that accuracy in converting an analog value into digital code is lowered because the degree of a capacitor mismatch is increased.

FIG. 1 is a detailed diagram showing the structure of a conventional fully differential Successive Approximation Register ADC (SAR-ADC) 100. The SAR-ADC 100 includes the conventional fully differential a Digital to Analog Converter (DAC) 110 configured to have a differential structure, a comparator 130 configured to compare a first output signal 111 and a second output signal 112, that is, voltages output from the DAC, with each other, and a Successive Approximation Register (SAR) 130.

The operation of the conventional fully differential Successive Approximation Register ADC (SAR-ADC) 100 is described below with reference to FIG. 1.

First, the conventional fully differential DAC 110 converts a digital signal into an analog voltage and outputs the analog voltage. The comparator 120 compares the sizes of the first output signal 111 and the second output signal 112 that are the output voltages of the conventional fully differential DAC 110. The comparator 120 outputs information, indicating which one of the two values is greater as a result of the comparison, as one digital value. Thereafter, the final digital result is obtained through the SAR 130.

Here, an interested point is the conventional fully differential DAC 110.

FIG. 2 is a circuit diagram showing the binary-weighted capacitor array of the conventional fully differential DAC 110.

In general, the conventional fully differential DAC 110 has a binary-weighted structure, such as that shown in FIG. 2. The binary-weighted structure refers to a structure in which the capacitor array of a DAC is increased twice toward upper bits.

Assuming that capacitance of a capacitor having the lowest digital code is unit capacitance of 1, capacitance of the capacitor is increased to double toward upper digital code. A binary search is performed for an efficient comparison. In this structure, it may be said that the most important thing is that a ratio of adjacent capacitors is 2.

A total amount of capacitance of capacitors that are connected in parallel is equal to the sum of the capacitors. A capacitor value of an upper bit that has the greatest influence on the performance of an ADC is divided using such as advantage. Since the capacitor value is divided by half in the binary-weighted structure, it becomes equal to capacitance of the capacitor of a lower bit thereof.

When the number of bits 'n' of digital code is small, the degree of a capacitor mismatch does not have a great influence on a result because it is relatively smaller than a value that corresponding to the Least Significant Bit (LSB). If the number of bits is increased, however, a mismatch may be increased to several times the LSB because a capacitor value is increased.

Such a capacitor mismatch has a great influence on Differential Non-Linearity (DNL) and Integral Non-Linearity (INL) as well as the Effective Number Of bits (SNOB) that is an important criterion indicative of the performance of an ADC, thereby making it difficult to fabricate a low-power high-resolution ADC.

SUMMARY OF THE INVENTION

Accordingly, the present invention has been made in an effort to solve the problems occurring in the related art, and an object of the present invention is to provide an ADC having high quality.

Another object of the present invention is to provide a method of achieving high resolution by calibrating an error attributable to a capacitor mismatch through a digital background calibration method and apparatus using an SAR structure that implements low power.

In order to achieve the above objects, according to one aspect of the present invention, there is provided a digital background calibration apparatus using capacitor division and swapping in order to reduce a capacitor mismatch effect of an ADC, including a DAC, a comparator, an SAR, a calibration unit, and a bit controller.

The DAC selects any one of an input signal, a ground voltage, and a reference voltage in response to a first control signal and a second control signal, converts the selected signal or voltage into an analog signal, and output a first conversion signal and a second conversion signal as the converted analog signal.

The comparator converts the first conversion signal and the second conversion signal into digital signals, outputs a first digital signal and a second digital signal as the converted digital signals, and outputs a third digital signal as a comparison value of the first conversion signal and the second conversion signal.

The SAR outputs a first register signal and a second register signal using the first digital signal and the second digital signal and output the first control signal using the third digital signal.

The calibration unit outputs a digital code calibration signal by calibrating a mismatch value of the first register signal in response to an external control signal.

The bit controller outputs the second control signal using the second register signal in response to the external control signal.

The digital code calibration signal is fed back to one side of the calibration unit, and the input signal includes a first input signal and a second input signal.

In order to achieve the above objects, according to another aspect of the present invention, there is provided a digital background calibration method through capacitor division and swapping in order to reduce a capacitor mismatch effect of an ADC, including a conversion step, a comparison step, a register step, a calibration step and a control step.

In the conversion step, one of an input signal, a ground voltage, and a reference voltage is selected in response to a first control signal and a second control signal, and a plurality of analog signals is output as a selected signal.

In the comparison step, a first digital signal and a second digital signal converted from the plurality of analog signals are output, the plurality of analog signals is compared with each other, and a third digital signal is output as a result of the comparison.

In the register step, a first register signal and a second register signal are output by dispersing the first digital signal and the second digital signal into the first register signal and the second register signal, and the third digital signal is output as a first control signal in the conversion step.

In the calibration step, a calibrated value is output by calibrating a mismatch value of the first register signal in response to an external control signal, and the calibrated and output value is fed back.

In the control step, the second register signal is output as the second control signal using the external control signal.

In the control step, the second register signal is shifted or the second control signal is output without change in response to the external control signal.

BRIEF DESCRIPTION OF THE DRAWINGS

The above objects, and other features and advantages of the present invention will become more apparent after a reading of the following detailed description taken in conjunction with the drawings, in which:

FIG. 4 shows graphs showing a relationship between the input and output of the ADC according to the present invention, wherein FIG. 4(a) shows the properties of a linear type in an ideal case and FIGS. 4(b) and 4(c) are analog to digital conversion graphs in different cases in which a capacitor mismatch is present;

FIG. 19 shows an operation table of a register dispersion unit in the digital background calibration apparatus using capacitor division and swapping in order to reduce a capacitor mismatch effect of the ADC according to the present invention;

DETAILED DESCRIPTION OF PREFERRED EMBODIMENTS

Figure 1:
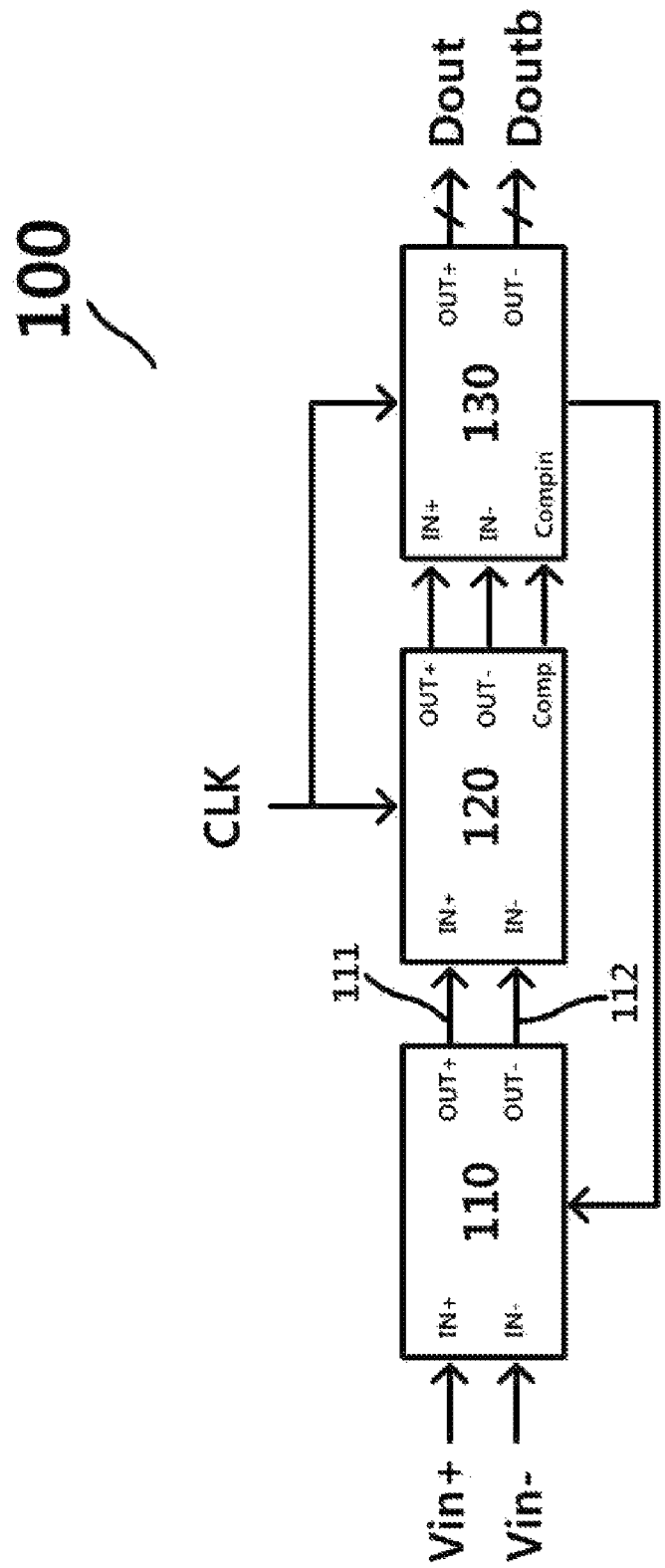
FIG. 1 is a detailed diagram showing the structure of a conventional fully differential Successive Approximation Register ADC (SAR-ADC)
Figure 2:
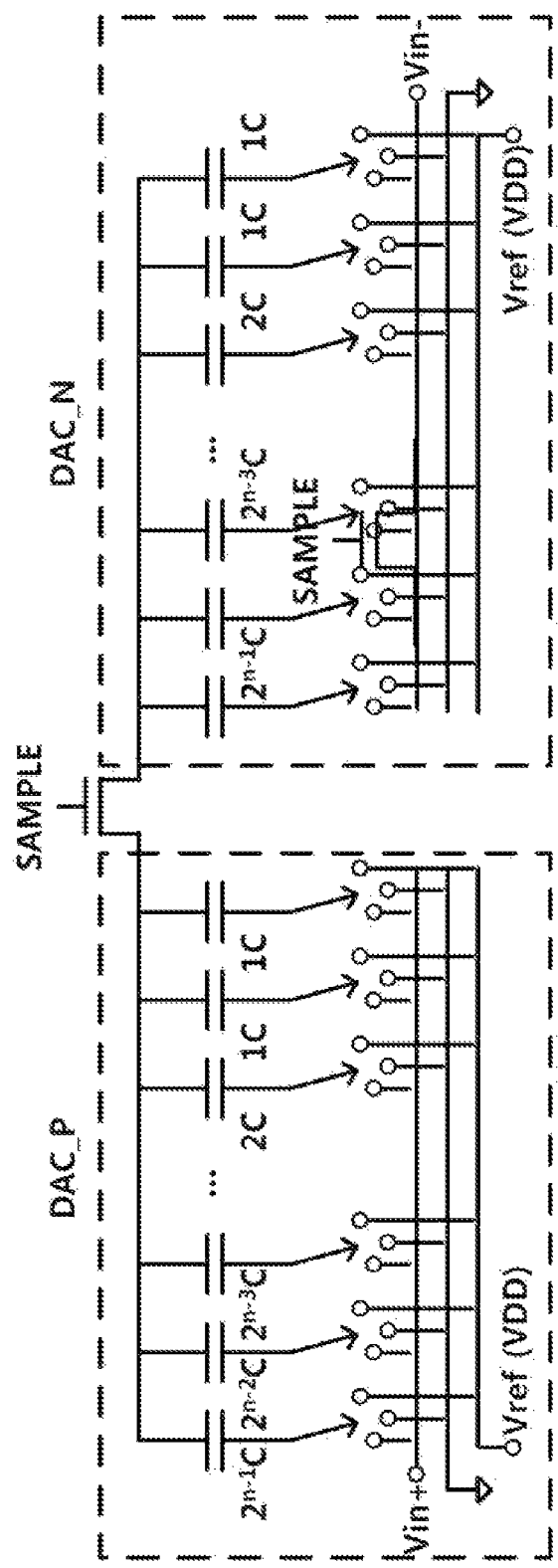
FIG. 2 is a circuit diagram showing the binary-weighted capacitor array of a conventional fully differential DAC 110.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
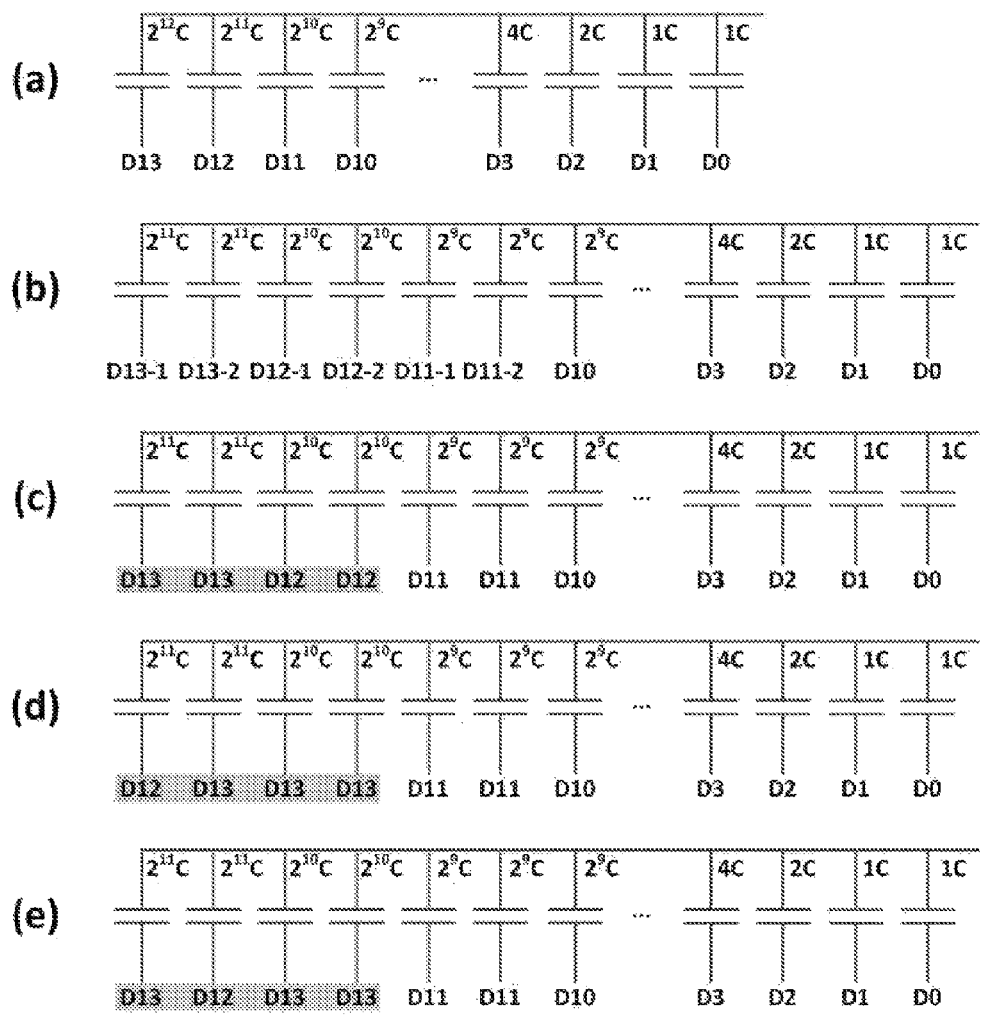
FIG. 3 is a circuit diagram showing an example in which a DAC 100 according to the present invention divides and combines capacitors.

FIG. 3 is a circuit diagram showing an example in which a DAC 100 according to the present invention divides and combines capacitors.

FIG. 3 shows an existing binary-weighted structure 'a' of a DAC and a structure 'b' in which an upper 3-bit capacitor has been divided. For example, in the case of the MSB D13, the MSB D13 has capacitor capacitance of original 4096 C, but the 4096 C is divided into two. Accordingly, two capacitors each having capacitance of 2048 C are formed as in FIG. 3(b). The capacitance 2048 C of the divided capacitor becomes equal to capacitance of a lower bit (i.e., the second MSB) D12 before the division. As a result of dividing the capacitor, three combinations for producing the capacitance of 4096 C corresponding to the MSB are present. A description of the three combinations is shown in FIGS. 3(c), 3(d), and 3(e). As a result, the structures shown in FIGS. 3(c), 3(d), and 3(e) become equal to the structure of FIG. 3(a).

If a mismatch is not present, the three combinations may have the same results. If a mismatch is present, however, the three combinations may have different results. The degree of a capacitor mismatch can be aware by comparing digital code results of the three combinations with each other.

Figure 4:
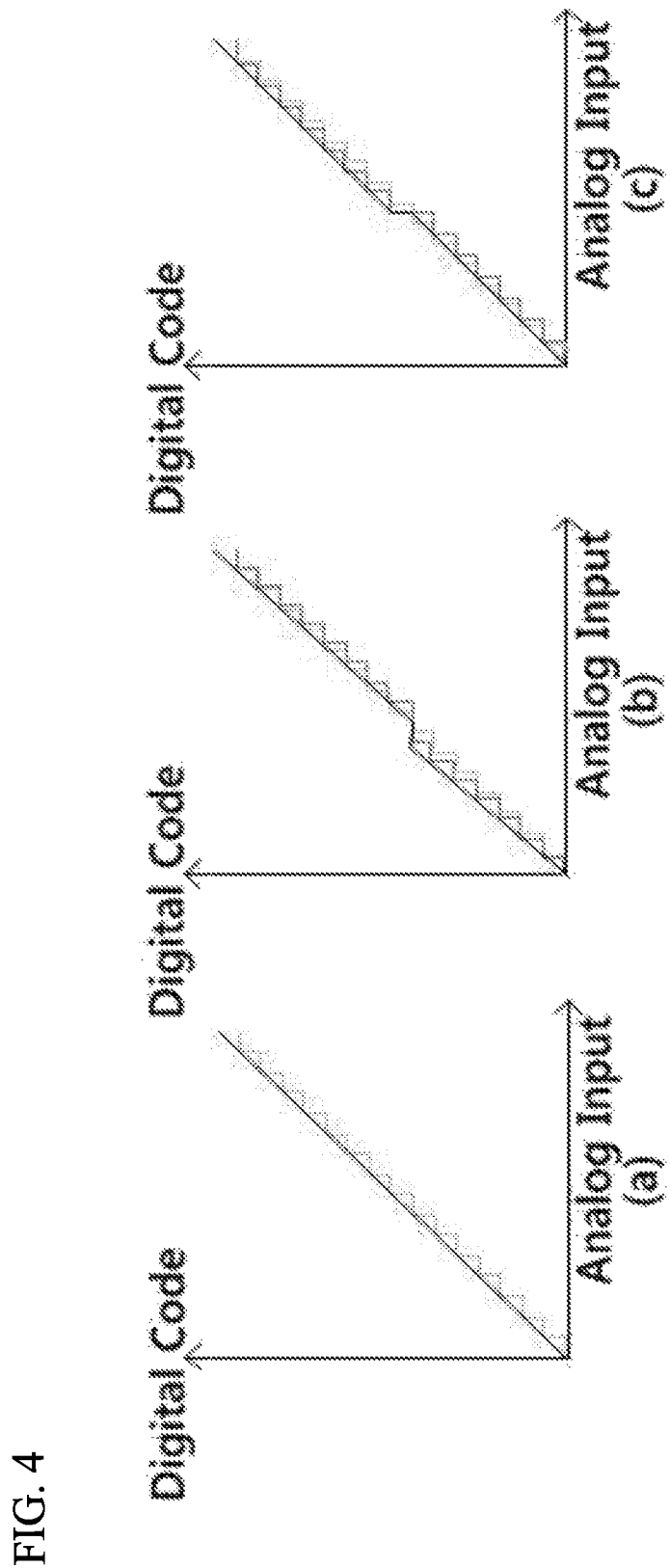

FIG. 4 shows graphs showing a relationship between the input and output of the ADC according to the present invention.

Referring to FIG. 4, the ADC having an ideal capacitor value shows a linear analog to digital conversion graph 'a'. If a capacitor mismatch is present, a slope in the graph is different from that in the ideal case. Furthermore, the number of specific digital codes may be very many as shown in FIG. 3(b) or missing code may appear as shown in FIG. 3(c) depending on a mismatch.

In each case, the slope is different depending on whether a mismatch is present or not. A difference can be clearly aware by counting the number of digital codes in a specific code region. Calibration can be performed using such a difference between code counts.

Figure 5:
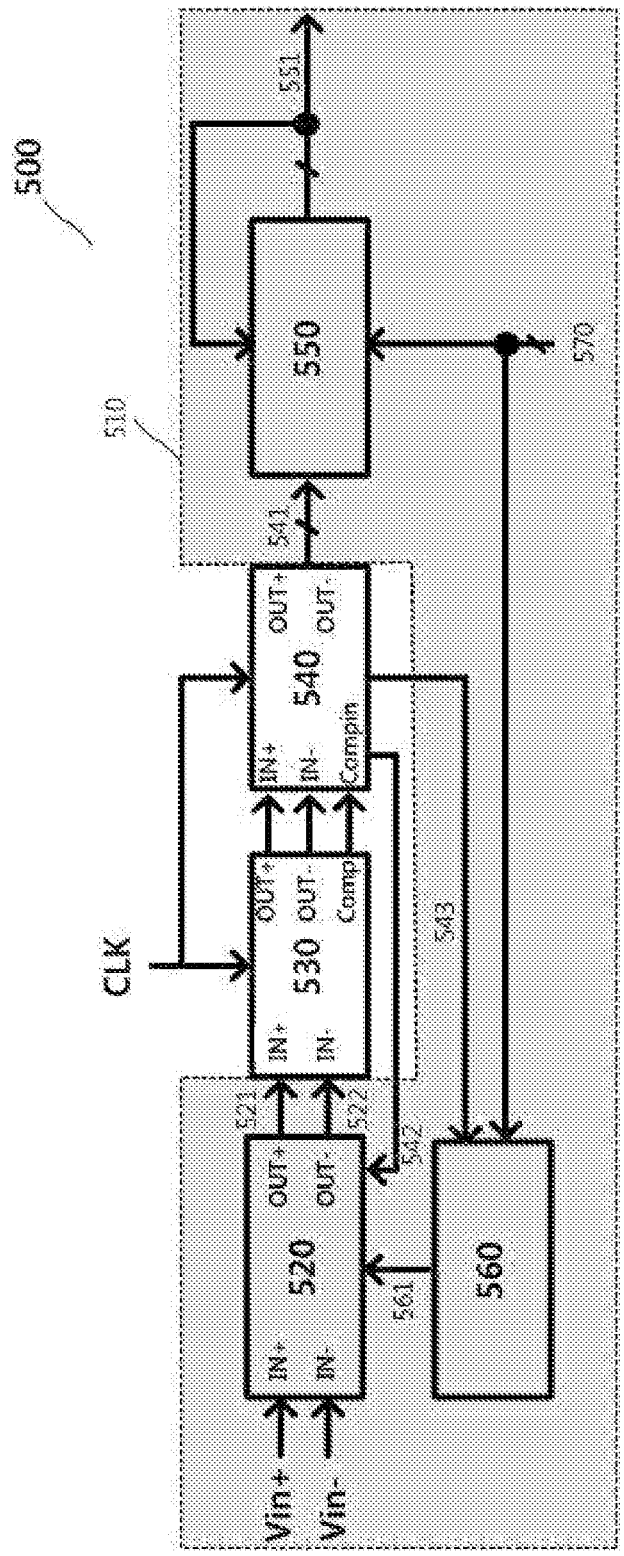
FIG. 5 is a detailed diagram showing the structure of an ADC according to an embodiment of the present invention.

FIG. 5 shows an embodiment of an ADC in a digital background calibration apparatus and method using capacitor division and swapping in order to reduce a capacitor mismatch effect of the ADC according to the present invention.

From FIG. 5, it can be seen that a correction block 510 has been additionally changed as compared with the conventional ADC of FIG. 1.

The operation of the ADC 500 according to the present invention is described below with reference to FIG. 5.

A bit controller 560 converts a second register signal 543 into a signal suitable for a DAC 520, that is, a second control signal 561. The bit controller 560 is controlled in response to an external control signal 570.

The DAC 520 selects one of an input signal, a ground voltage, and a reference voltage in response to the second control signal 561, that is, a digital signal, and a first control signal 542 that is a control signal output from the SAR 540, converts the selected signal or voltage into analog signals, and outputs a first conversion signal 521 and a second conversion signal 522 as the converted signals.

The comparator 530 converts the first conversion signal 521 and the second conversion signal 522, that is, two differential analog signals, into digital signals, outputs a first digital signal 'out−' and a second digital signal 'out+' as the converted signals, compares the first conversion signal and the second conversion signal with each other, and outputs a third digital signal 'comp' as a comparison value.

For a detailed description of the structure or operation of the comparator 530, reference may be made to the conventional comparator, and thus the detailed description is omitted.

The digital signal becomes a first register signal Dout 541, that is, a digital signal of the ADC, through the SAR 540.

The SAR 540 outputs the first register signal 541 and the second register signal 543 using the first digital signal 'out−' and the second digital signal 'out+' and outputs the first control signal 542 using the third digital signal 'comp'.

For a detailed description of the structure or operation of the SAR 540, reference may be made to the conventional comparator, and thus the detailed description is omitted.

A calibration unit 550 analyzes the first register signal Dout 541 in response to the control signal of the external control signal 570, calibrates a mismatch value based on a result of the analysis, and outputs a digital code calibration signal Dcal_out 551.

The bit controller 560 outputs the second control signal 561 in response to the external control signal 570 using the second register signal 543.

The correction block 510 of the present invention may be summarized as follows.

The correction block 510 includes the DAC 520 having a fully differential binary-weighted DAC, that is, a structure in which a capacitor value of an upper bit is divided by half.

The capacitor may be divided in multiple ways as much as that is desired in an upper bit.

Figure 6:
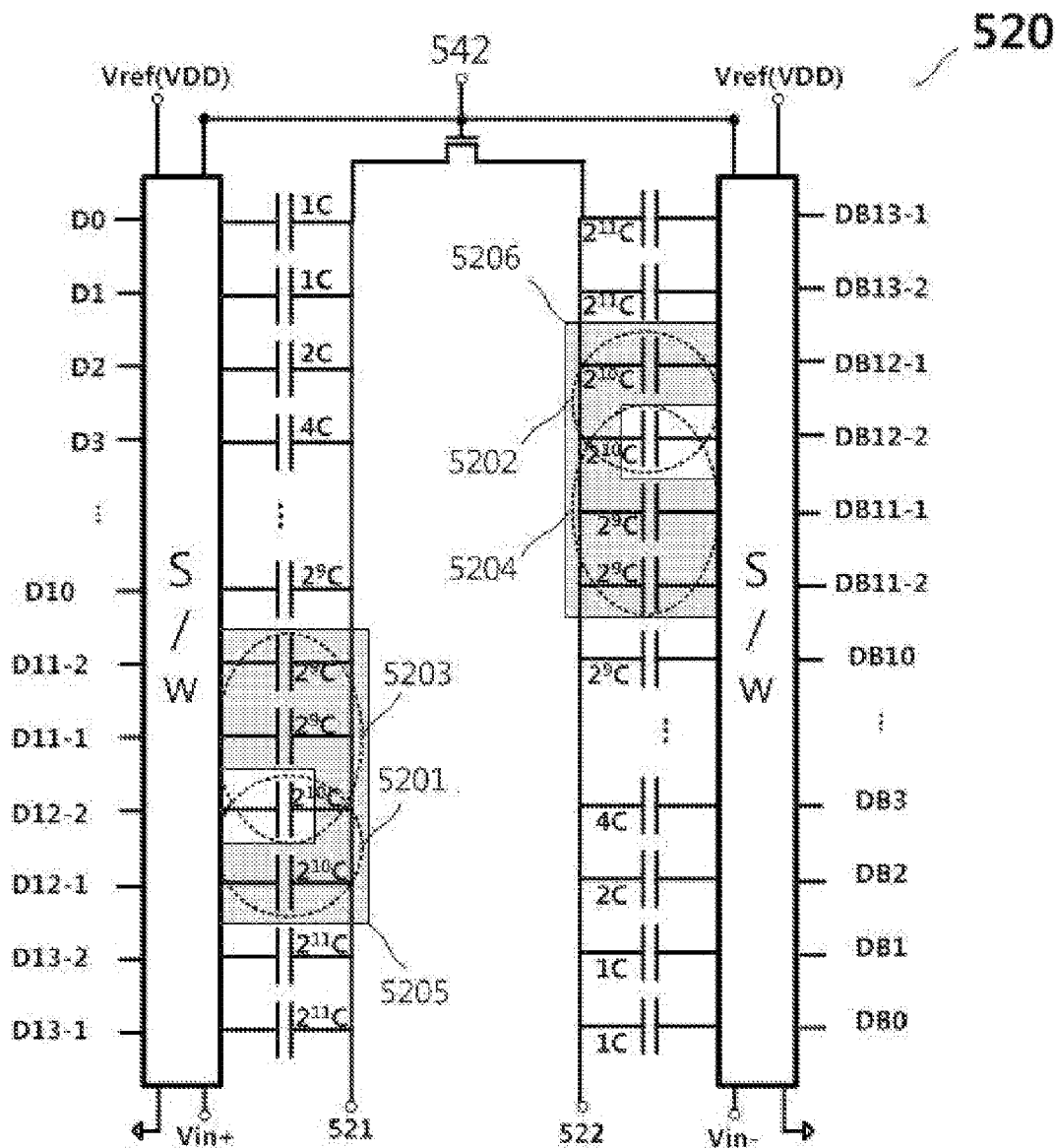
FIG. 6 shows an embodiment in which the capacitors of a DAC in a digital background calibration apparatus using capacitor division and swapping in order to reduce a capacitor mismatch effect of the ADC according to the present invention are divided in multiple ways.

FIG. 6 shows an embodiment in which the capacitors of the DAC 520 in a digital background calibration apparatus and method using capacitor division and swapping in order to reduce a capacitor mismatch effect of the ADC according to the present invention are divided in multiple ways.

FIG. 6 shows an embodiment of the DAC 520 in which division is performed using a capacitor of upper 3 bits in the ADC of 14 bits.

The DAC 520 includes a first capacitor unit, a second capacitor unit, a first switch unit, a second switch unit, and a third switch unit.

The first capacitor unit includes a plurality of first capacitors connected in parallel.

The second capacitor unit includes a plurality of second capacitors connected in parallel.

The first switch unit includes a plurality of first switches for connecting one of the reference voltage, the ground voltage, and the first input signal to a plurality of first capacitors in response to the first control signal and the second control signal.

The second switch unit includes a plurality of second switches for connecting one of the reference voltage, the ground voltage, and the second input signal to a plurality of second capacitors in response to the first control signal and the second control signal.

The third switch unit has one terminal connected to the first capacitor unit and the other terminal connected to the second capacitor unit and operates in response to the first control signal.

The first capacitor unit and the second capacitor unit have a binary-weighted structure.

In the DAC 520 in which the capacitor of the 14-bit ADC is divided, a value of the capacitor corresponding to the Most Significant Bit (MSB) is $2^{n-2}C$ and has capacitance of 4096 C.

In the divided structure, an MSB capacitor includes two capacitors each having capacitance of 2048 C. The same rule is applied to lower bits of the MSB.

In the case of a lower bit (i.e., the second MSB) of the MSB, the capacitor having the original capacitance of 2048 C is divided into two capacitors each having capacitance of 1024 C.

A capacitor having a lower bit (i.e., the third MSB) of the MSB is divided into two capacitors each having capacitance of 512 C.

When the same digital bit is connected to a node on one side of a capacitor, it is a parallel capacitor connection, and total capacitance thereof is the sum of capacitance of the capacitors.

As shown in FIG. 3(c), when a value of the digital D13 is connected top [D13-1] and [D13-2], total capacitance of capacitors corresponding to the D13 bit becomes 4096 C. The D13 bit is the MSB in the DAC 520 in which the capacitor of the 14-bit ADC is divided. Since the DAC has a differential structure, the digital inputs of the DAC 520 in which the capacitors of the DAC on the left side (i.e., a positive DAC part) and the right side (i.e., a negative DAC part) are divided are a pair and changed together.

Case where a D12 bit (i.e., the 2nd MSB) and a D11 bit (i.e., the third MSB) are changed according to the same principle are described below. Originally, the D12 and the D11 are a capacitor having capacitance of 2048 C and a capacitor having capacitance of 1024 C. A total of three combinations of the D12 and the D11 can be produced by changing the node connections of a total of four capacitors that include the two divided capacitors each having capacitance of 1024 C and the two divided capacitors each having capacitance of 512 C.

The first case corresponds to a case where [D12-1] and [D12-2] 5201 are bound and D12 is bound to [DB12-1] and [DB12-2] 5202 and connected to DB12, thus producing the capacitor having capacitance of 2048 C. In this case, [D11-1] and [D11-2] are naturally bound to form. D11, and [DB11-1] and [DB11-2] are bound to form DB11. Each of the D11 and the DB11 becomes the capacitor having capacitance of 1024 C.

The second case corresponds to a case where D12 is connected to [D12-2], [D11-1], and [D11-2] 5203 and DB12 is connected to [DB12-2], [DB11-1], and [DB11-2] 5204, thus forming the capacitor having capacitance of 2048 C. In this case, [D12-1] is connected to D11 and [DB12-1] is connected to DB11, thus each becoming the capacitor having capacitance of 1024 C.

The third case is similar to the second case. [D12-1], [D11-1], and [D11-2] 5205 are connected to D12, and [DB12-1], [DB11-1], and [DB11-2] 5206 are connected to DB12, thus producing the capacitor having capacitance of 2048 C. [D12-2] is connected to D11 and [DB12-2] is connected to DB11, thus producing the capacitor having capacitance of 1024 C.

A variety of binary-weighted structures can be formed by changing a digital bit connected to the node of a capacitor in the DAC 520 in which the capacitor of the DAC 520 is divided as described above.

The bit controller 560 of the present invention generates the second control signal 561 using the external control signal 570.

The second control signal 561 is a signal to define one of internal swapping modes that will change the role of a capacitor.

If the number of upper bits in which a capacitor is divided is n, the number of cases is three in exchanging the role of a capacitor having two adjacent bits. A total number of cases is [(3−1)n+1=2n+1] because [D13-1] and [D13-2] are connected to D13 and [D12-1] and [D12-2] are connected to D12 sequentially in relation to the number of swapping cases for each bit. Accordingly, a minimum integer 'x', that is, $x \geq \log_2(2n+1)$ has only to become the number of bits of the external control signal 570.

The bit controller 560 can be implemented through bit controllers. If a capacitor having upper 3 bits is divided as in this example, a total number of internal swapping modes are 7, and the number of bits of the external control signal 570 becomes 'x=3'.

Figure 7:
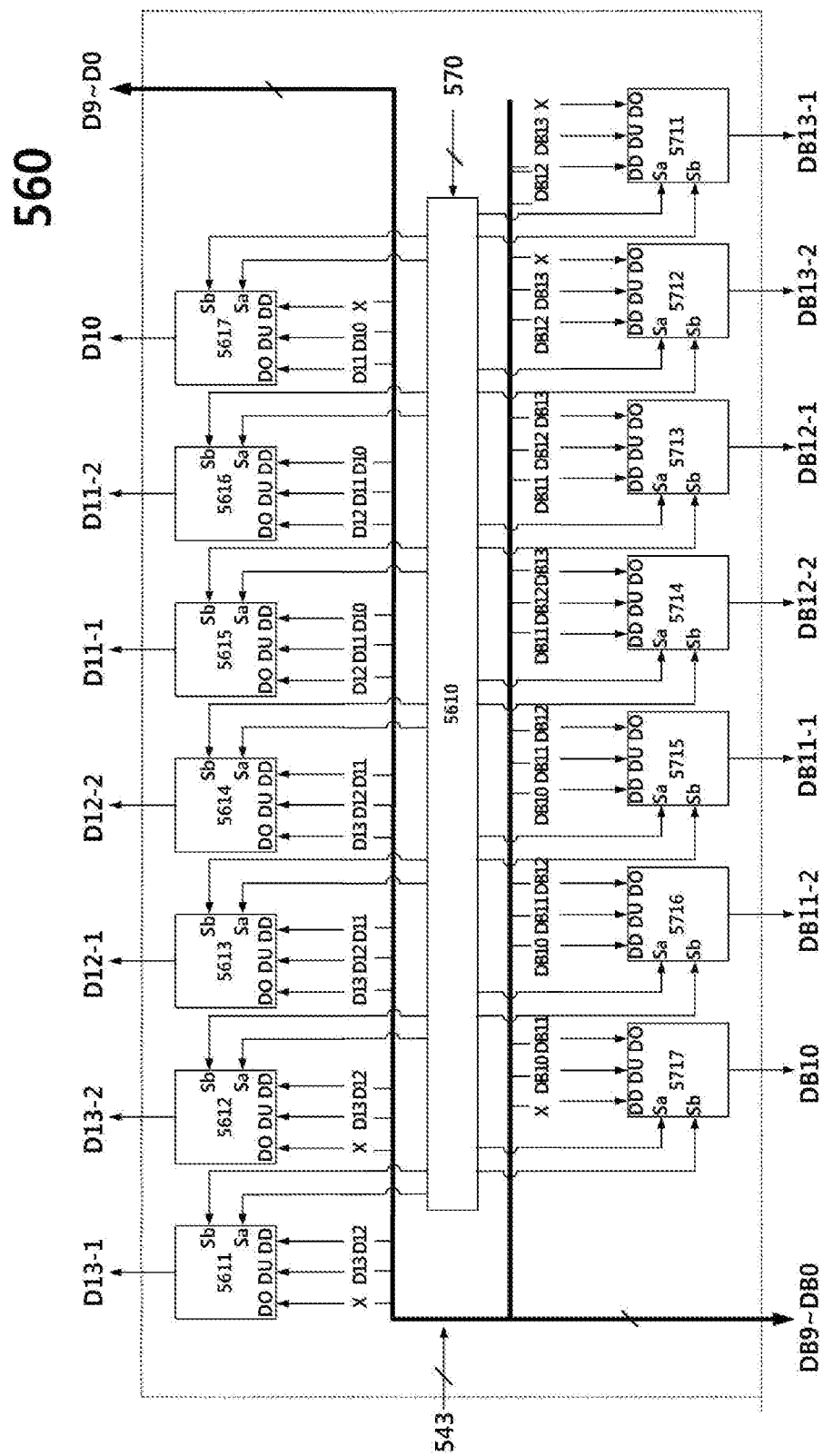
FIG. 7 shows an embodiment of a bit controller 560 in the digital background calibration apparatus using capacitor division and swapping in order to reduce a capacitor mismatch effect of the ADC according to the present invention.

FIG. 7 shows an embodiment of the bit controller 560 in accordance with the digital background calibration apparatus and method using capacitor division and swapping in order to reduce a capacitor mismatch effect of the ADC according to the present invention.

The bit controller 560 includes a plurality of bit controllers and a bit control unit 5610.

The plurality of bit controllers receives the second register signal 543 and shifts the second register signal 543 using the external control signal 570 or outputs the second register signal 543 as the second control signal 561.

The number of bit controllers that form the bit controller 560 can be calculated as follows.

The number of bit controllers=(2×the number of upper bits of a divided capacitor+1)×2

All of the plurality of bit controllers have the same structure.

The bit control unit 5610 is connected to one side of the plurality of bit controllers.

The bit control unit 5610 receives C0, C1, and C2, that is, the external control signal 570 of 3 bits and outputs a first bit control signal Sa and a second bit control signal sb.

The second register signal 543, that is, a digital bit value of the SAR 540, is inputted to the bit controller 560. The second register signal 543 is connected to an up-bit signal DU, a down-bit signal DD, and an existing bit signal DO of each of the plurality of bit controllers.

The second register signal 543 is a digital signal.

The output signal of each of the plurality of bit controllers becomes the second control signal 561, which is inputted to the DAC 520.

Figures 8, 9:
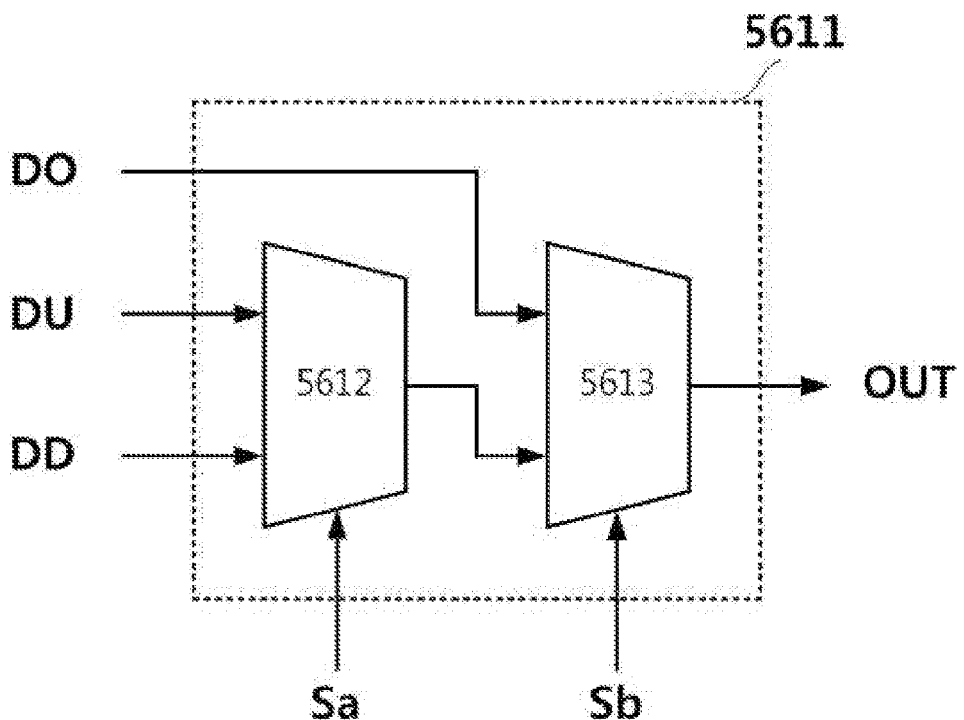
FIG. 8 shows an embodiment of a bit controller 560 in the digital background calibration apparatus using capacitor division and swapping in order to reduce a capacitor mismatch effect of the ADC according to the present invention.
FIG. 9 shows an embodiment of an exemplary operation table of the bit controller in a digital background calibration apparatus and method using capacitor division and swapping in order to reduce a capacitor mismatch effect of the ADC according to the present invention.

FIG. 8 shows an embodiment of the bit controller 560 in accordance with the digital background calibration apparatus and method using capacitor division and swapping in order to reduce a capacitor mismatch effect of the ADC according to the present invention.

Referring to FIG. 8, a first bit controller 5611, that is, one of the plurality of bit controllers included in the bit controller 560, includes a first multiplexer 5612 and a second multiplexer 5613.

The first multiplexer 5612 receives the up-bit signal DU and the down-bit signal DD and outputs a first multiplexer output signal in response to the first bit control signal Sa.

The second multiplexer 5613 receives the existing bit signal DO and the first multiplexer output signal and outputs the second control signal OUT 561 to the DAC 520 in response to the second bit control signal Sb.

FIG. 9 shows an embodiment of an exemplary operation table of the bit controller 560 in accordance with a digital background calibration apparatus and method using capacitor division and swapping in order to reduce a capacitor mismatch effect of the ADC according to the present invention.

Referring to FIG. 9, the bit controller 560 selects one of 7 internal swapping modes in response to the external control signal 570. The second register signal 543 of the SAR 540 that corresponds to a selected mode is converted into the second control signal 561.

The external control signal 570 is a 3-bit signal and indicated by C0, C1, and C2 in the table.

The second control signal 561, that is, a signal converted as described above, controls switches S/W within the DAC 520.

The second control signal 561 has a reset mode in which the DAC 520 is reset in response to the first control signal 542 output from the SAR 540, a sample mode in which an input signal is stored, and a hold mode. In the hold mode, a value stored in the sample mode is transmitted.

If each of bits of the second control signal 561 is 1 in the hold mode, a capacitor node within the DAC 520 is connected to the reference voltage (Vref=VDD). If each of bits of the second control signal 561 is 0(zero) in the hold mode, the capacitor node is connected to the ground voltage GND.

A method of controlling, by the first control signal 542 of the SAR 540, the DAC 520 is a common method using an SAR, and thus a detailed description thereof is omitted.

The second control signal 561 produces the first register signal Dout 541, that is, the output signal of the ADC 500, through the DAC 520, the comparator 530 for performing a comparison on voltage, and the SAR 540.

Figure 10:
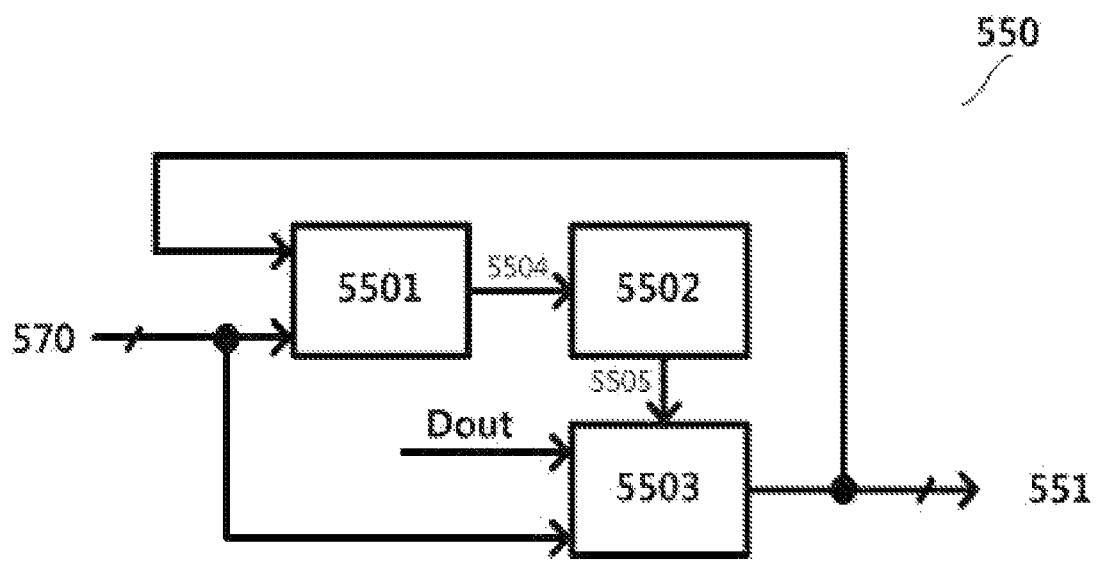
FIG. 10 shows an embodiment of a calibration unit 550 in the digital background calibration apparatus using capacitor division and swapping in order to reduce a capacitor mismatch effect of the ADC according to the present invention.

FIG. 10 shows an embodiment of the calibration unit 550 in accordance with the digital background calibration apparatus and method using capacitor division and swapping in order to reduce a capacitor mismatch effect of the ADC according to the present invention.

Referring to FIG. 10, the calibration unit 550 basically includes a code count unit 5501, a register update unit 5502, and an addition unit 5503, and a detailed description is as follows.

The calibration unit 550 outputs the finally calibrated digital code calibration signal Dcal_out 551 by harmonizing the external control signal 570, the first register signal Dout 541 that is a digital code result, and the digital code calibration signal Dcal_out 551 that has been fed back and calibrated.

The code count unit 5501 receives the external control signal 570 and transfers a code count matrix signal 5504 indicative of the degree of a capacitor mismatch of the digital code calibration signal to the register update unit 5502.

The register update unit 5502 receives the code count matrix signal 5504, analyzes code count information, and inputs a register update unit output signal 5505 to the addition unit 5503.

The addition unit 5503 receives the first register signal Dout 541 in addition to the register update unit output signal 5505, adds a calibration value, obtained by analyzing the register update unit output signal 5505, to the first register signal Dout 541 and the register update unit output signal 5505, and outputs the digital code calibration signal Dcal_out 551 as a result of the addition.

Here, the digital code calibration signal Dcal_out 551 is fed back to the code count unit 5501.

The code count unit 5501 receives the external control signal 570 and the digital code calibration signal Dcal_out 551 as feedback and determines how a value of an input signal has been output through a capacitor within the DAC 520.

What mode of the seven types of internal swapping modes has been driven can be determined based on a result of the determination.

A data value for a mode is determined with reference to the conversion table of the bit controller 560 shown in FIG. 9. As a result, this is the same as that one of the seven types of internal swapping modes swapped with digital result data is received as input. For example, if three upper bits are to be divided, there are a total of the seven types of internal swapping modes. Calibration is started based on information about the seven types of internal swapping modes and the digital result data.

After one of the seven types of internal swapping modes is determined, the number of codes in a predetermined section is counted according to a corresponding mode. The reason why the codes are counted is that if a capacitor mismatch is present, an analog to digital conversion graph is changed depending on the corresponding mode of the seven types of internal swapping modes, resulting in a difference of the code count. If all capacitors maintain a binary-weighted structure without a mismatch, all the cases have the same result even if the corresponding mode switches to any one of the seven types of internal swapping modes. As a result, only one analog to digital conversion graph is present. If a mismatch is present and a slope is changed, however, there is a difference in the code count depending on the seven types of internal swapping modes.

A code count is changed as follows. If a range (i.e., a gray portion in FIG. 11) of specific digital codes is determined and the codes are counted, a code count for a corresponding analog input range is obtained.

Figure 11:
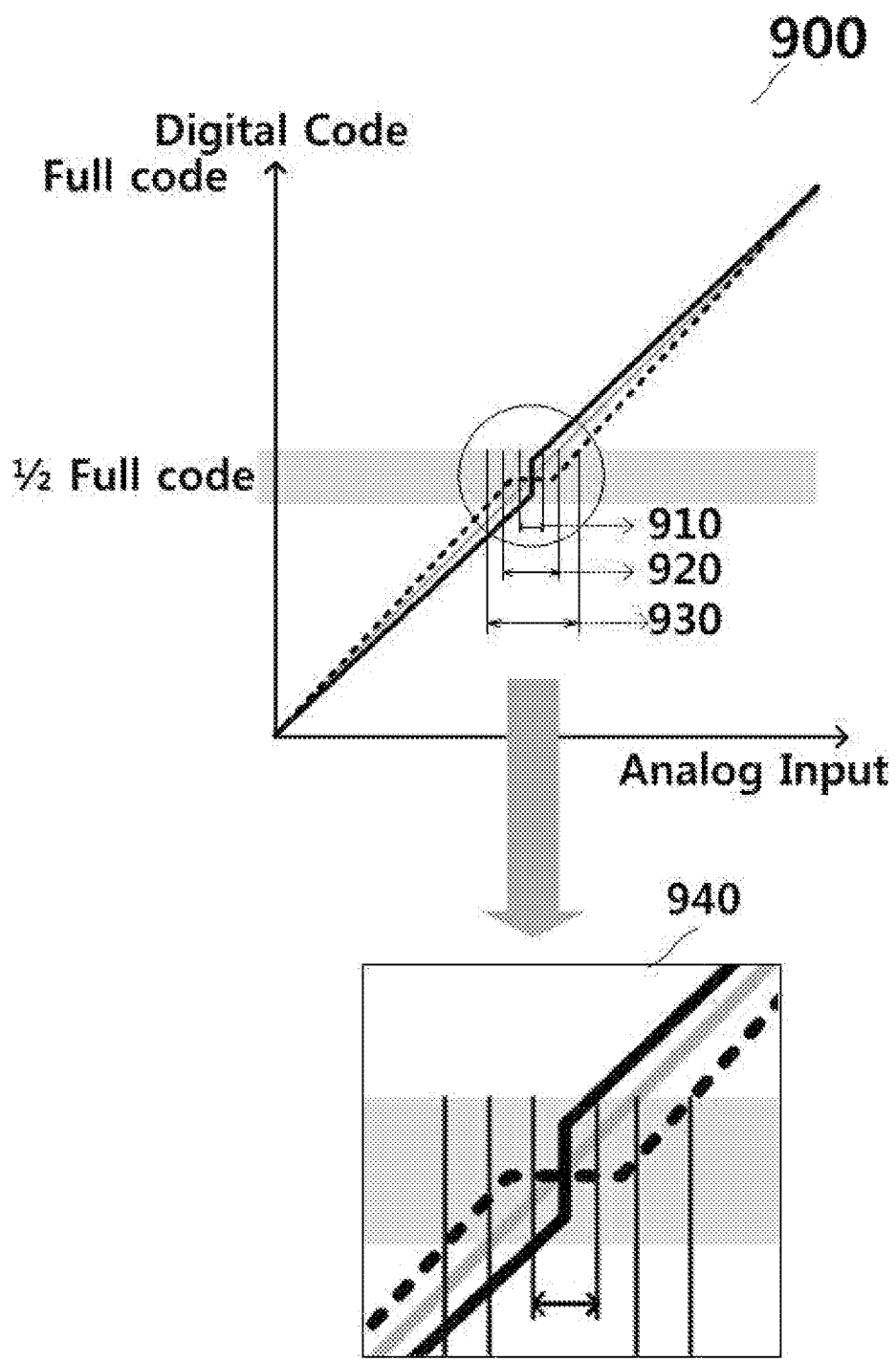
FIG. 11 shows an embodiment of an analog to digital conversion graph in the digital background calibration apparatus using capacitor division and swapping in order to reduce a capacitor mismatch effect of the ADC according to the present invention.

FIG. 11 shows an embodiment of an analog to digital conversion graph in accordance with the digital background calibration apparatus and method using capacitor division and swapping in order to reduce a capacitor mismatch effect of the ADC according to the present invention.

From an enlarged portion 940 of a middle code portion in FIG. 11, it can be clearly seen that a dark dotted line corresponds to a region C 930 that is the widest analog range, a dark solid line corresponds to a region A 910 that is the narrowest analog range, and a gray solid line corresponds to a region B 920 that is the middle analog range.

A range of the specific digital codes is determined as follows. If a mismatch is present in a capacitor corresponding to the MSB, the significant characteristic appears near the middle code (i.e., 1/2 full code) as shown in FIG. 11. If the degree of a capacitor mismatch is positive (>0) and the capacitor corresponding to the MSB is greater than the sum of all the remaining lower capacitors, there is a characteristic (i.e., a dotted line in FIG. 11) in which many specific codes appear. Furthermore, since a slope becomes smaller than gray color (i.e., a linear and ideal case), a corresponding analog range also becomes the region C 930 greater than the region B 920. In contrast, if the degree of a capacitor mismatch is negative (<0) and the capacitor corresponding to the MSB is smaller than the sum of all the remaining lower capacitors, there occurs a portion (i.e., a missing code region, a solid line in FIG. 11) in which specific codes do not appear. Furthermore, a slope becomes greater than gray color (i.e., the linear and ideal case), a corresponding analog range becomes the region A 910 smaller than the region B 920.

That is, when changing the roles of the MSB and lower bits thereof, if a mismatch of the MSB is great near the middle code, a code count becomes great. If the mismatch is small, the code count becomes small.

Figure 12:
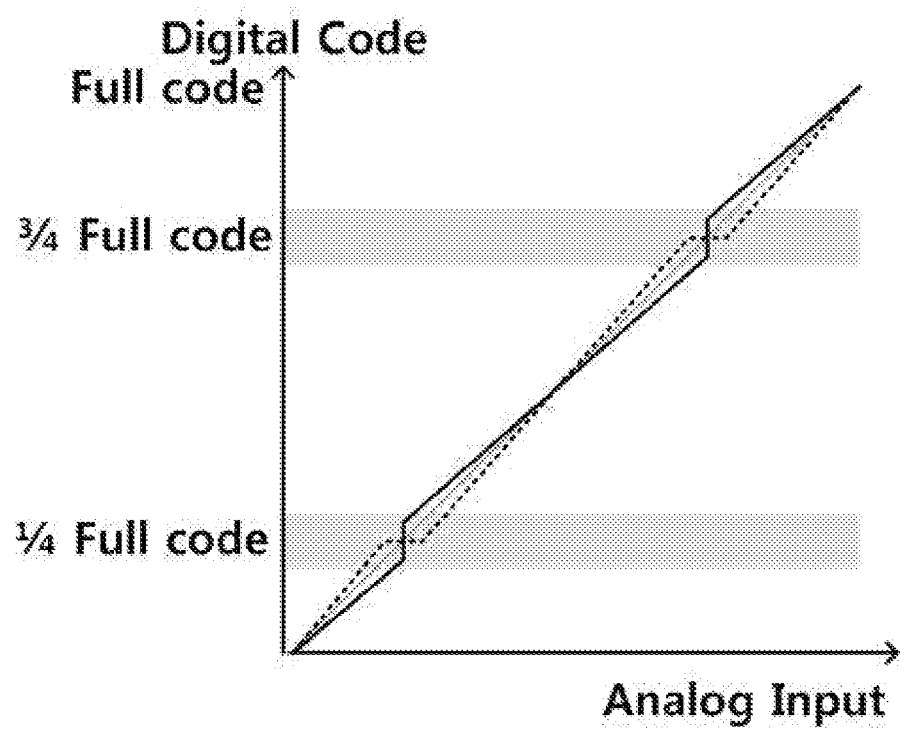
FIG. 12 shows another embodiment of an analog to digital conversion graph in the digital background calibration apparatus using capacitor division and swapping in order to reduce a capacitor mismatch effect of the ADC according to the present invention.

FIG. 12 shows another embodiment of an analog to digital conversion graph in accordance with the digital background calibration apparatus and method using capacitor division and swapping in order to reduce a capacitor mismatch effect of the ADC according to the present invention.

Referring to FIG. 12, if a mismatch is present in a lower bit (i.e., the second MSB) of the MSB according to the same principle, the above phenomenon appears in full 1/4 code, and the same phenomenon also appears in 3/4 code symmetrically.

Figure 13:
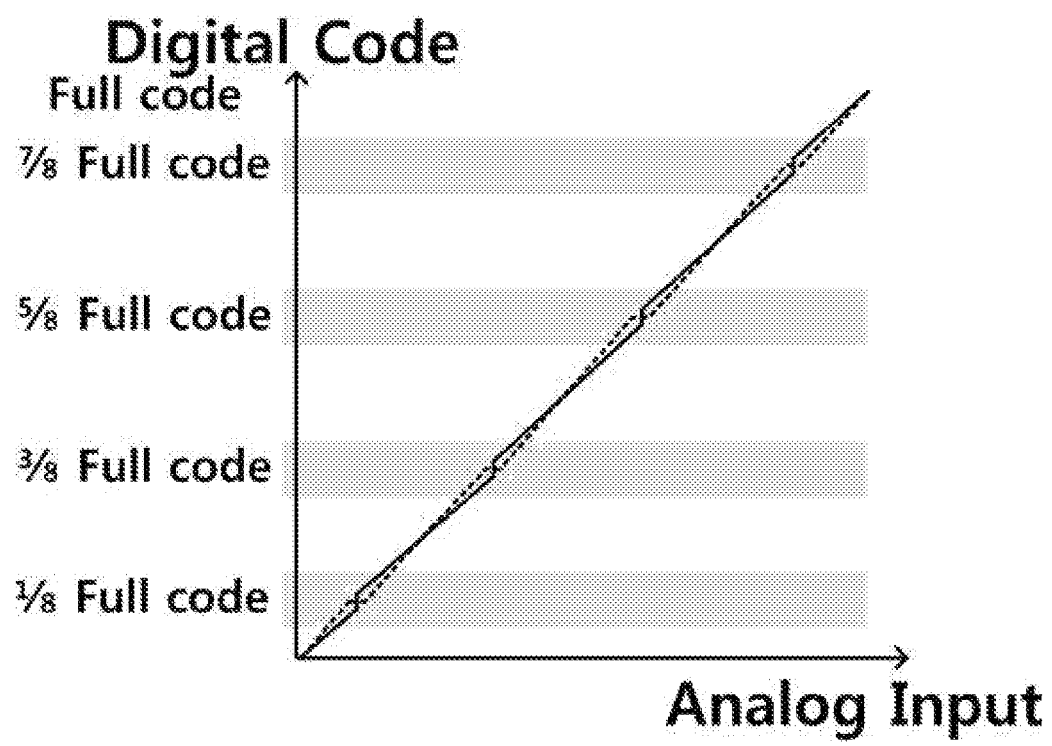
FIG. 13 shows yet another embodiment of an analog to digital conversion graph in the digital background calibration apparatus using capacitor division and swapping in order to reduce a capacitor mismatch effect of the ADC according to the present invention.

FIG. 13 shows yet another embodiment of an analog to digital conversion graph in accordance with the digital background calibration apparatus and method using capacitor division and swapping in order to reduce a capacitor mismatch effect of the ADC according to the present invention.

Referring to FIG. 13, in the case of a lower bit (i.e., the third MSB) of the MSB next to the second MSB, the phenomenon appears in 1/8, 3/8, 5/8, 7/8 full codes.

Accordingly, in relation to each of the seven types of internal swapping modes, a code count is stored in a range corresponding to the number of codes that have been designated up and down on the basis of full 1/2 code that will indicate the degree of a capacitor mismatch of the MSB, full 1/4 and 3/4 codes that will indicate the degree of a capacitor mismatch of a lower bit (i.e., the second MSB) of the MSB, and full 1/8, 3/8, 5/8, and 7/8 codes that will indicate the degree of a capacitor mismatch of a lower bit (i.e., the third MSB) next to the second MSB. As a result, the code count matrix signal 5504 is generated and transferred to the register update unit 5502.

Figure 14:
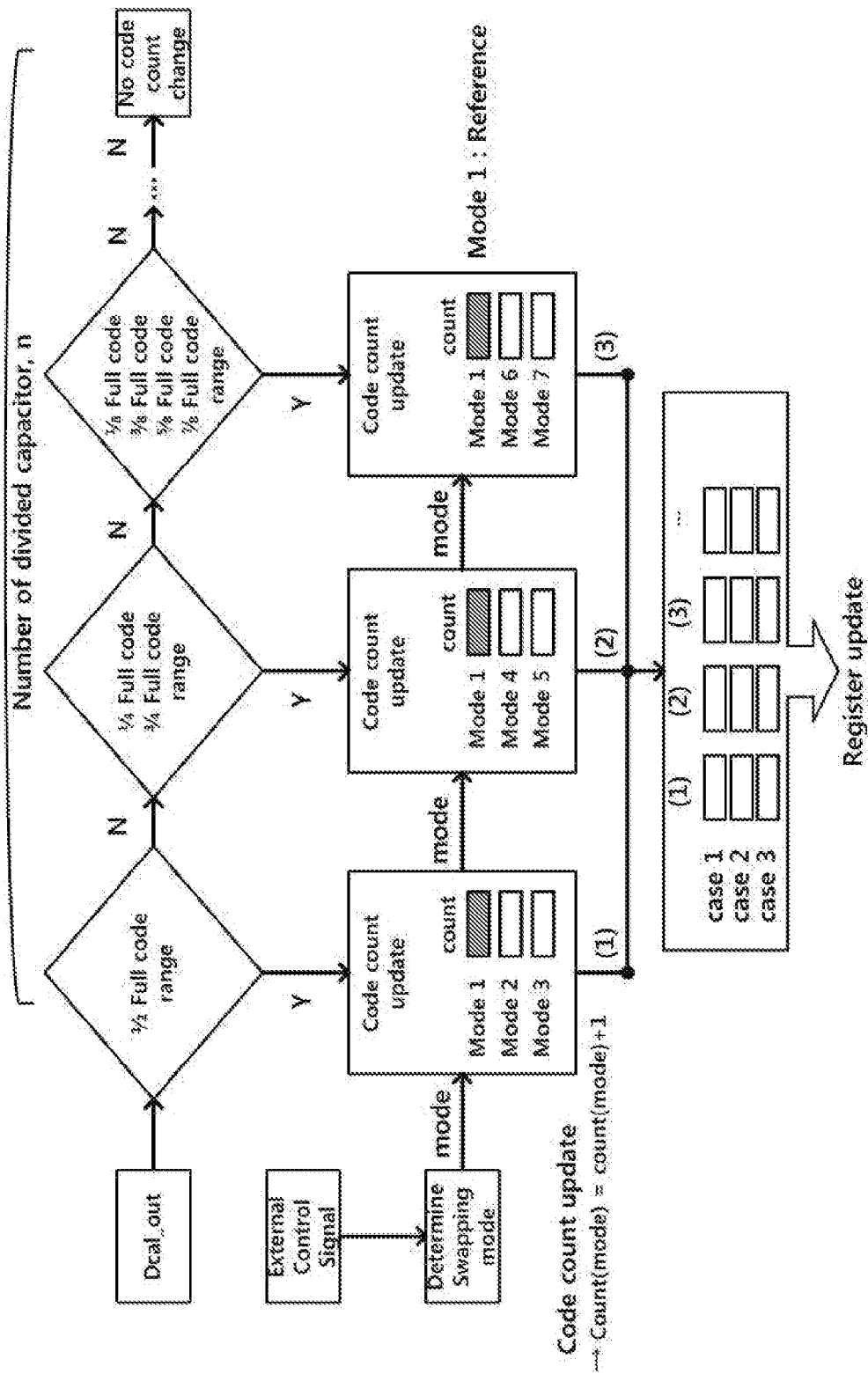
FIG. 14 shows an embodiment of a code count unit in the digital background calibration apparatus using capacitor division and swapping in order to reduce a capacitor mismatch effect of the ADC according to the present invention.

FIG. 14 shows an embodiment of the code count unit 5501 in accordance with the digital background calibration apparatus and method using capacitor division and swapping in order to reduce a capacitor mismatch effect of the ADC according to the present invention.

The operation of the code count unit 5501 is described with reference to the flowchart of FIG. 14. The code count unit 5501 receives a calibrated digital code calibration signal Dcal_out 551 and the external control signal 570 as inputs and checks whether or not corresponding codes have entered the full 1/2 code range. If, as a result of the check, the codes are found to enter the full 1/2 code range (Y), the number of counts in the first column that corresponds to a corresponding mode is increased by 1 according to one of the seven types of internal swapping modes that has been obtained through the external control signal 570. Here, since the full 1/2 code indicates the degree of a capacitor mismatch of the MSB, a code has only to be performed on three combinations that produce the MSB.

If reference is made to the table regarding the seven types of internal swapping modes of FIG. 9, a count has only to be performed in mode 1, mode 2, and mode 3, that is, references. If, as a result of the check, the codes are found to not enter the full 1/2 code range (N), whether or not the codes enter the full 1/4 and 3/4 code ranges is checked. The same operation is performed. If, as a result of the check, the codes are found to enter the full 1/4 and 3/4 code ranges, the number of counts in the second column is increased. Likewise, in this case, a count is performed in mode 1, mode 4, and mode 5, that is, references indicating the degree of a capacitor mismatch of the lower bit (i.e., the second MSB) of the MSB.

An operation is performed as many as the number corresponding to the number of upper bits that have been divided as described above. If the codes do not enter any range up to the last, there is no change in the code count. A matrix in which the first column to an $n^{th}$ column have been merged [(the number of combinations for producing a specific capacitor capacitance)×(the number of upper bits 'n' corresponding to a divided capacitor)=3×n] is transferred to the register update unit 550.

The next circuit of the calibration unit 550 is the register update unit 5502.

Each of divided MSB capacitors includes a register capable of storing the degree of a capacitor mismatch. In the case of a DAC having a differential structure, one register is placed in two combined capacitors because a [Dx] signal and a [DBx] signal are moved together differentially. For example, in the case of FIG. 6, there are a total of six registers (2n): a register REG 13-1 corresponding to two combined capacitors [D13-1] and [DB13-1] and registers from a register REG 13-2 to a register REG 11-2 of [D11-2] & [DB11-2].

The register update unit 5502 receives the code count matrix signal 5504 from the code count unit 5501. The register update unit 5502 analyzes information about a code count and plays a role of updating a value of a register that corresponding to each capacitor.

The code count matrix signal 5504 produces the analyzed information about a code count for a specific range according to each of the seven types of internal swapping modes in a matrix form.

A reference for the code count is mode 1 in which the roles of all the capacitors are not swapped. If the roles of the MSB and lower bits thereof are to be swapped, a comparison is performed on a code count in the full 1/2 code range that is most influenced by a ratio of two, that is, a code count in the first column. If the roles of the lower bits of the MSB and lower bits thereof are to be swapped, a comparison is performed on a code count in the full 1/4 and 3/4 code ranges, that is, a code count in the second column.

In the merge mode, code counts are compared with each other as described above.

A method of updating a register value by comparing code counts with each other is described below.

Figure 15:
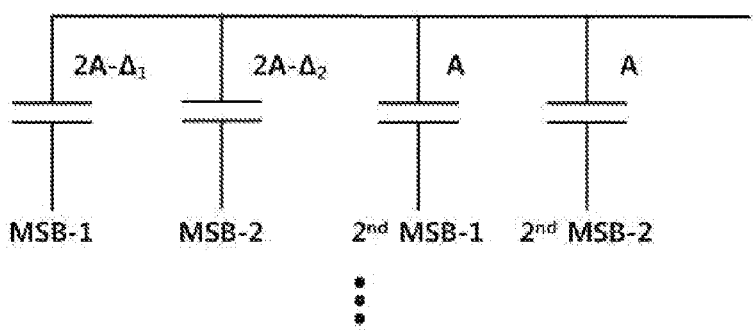
FIG. 15 is a circuit diagram shows an example of cases where a mismatch is present in the MSB in the DAC 520 of the digital background calibration apparatus using capacitor division and swapping in order to reduce a capacitor mismatch effect of the ADC according to the present invention and a table according to combinations.

FIG. 15 is a circuit diagram shows an example of cases where a mismatch is present in the MSB in the DAC 520 of the digital background calibration apparatus and method using capacitor division and swapping in order to reduce a capacitor mismatch effect of the ADC according to the present invention and a table according to combinations.

Referring to FIG. 15, a mismatch of a total of $\Delta=\Delta_1+\Delta_2$ is present, and mismatches $\Delta_1$ and $\Delta_2$ are present in respective divided capacitors.

The first case Case 1 corresponds to a reference for all the cases. In order to produce a capacitor corresponding to the MSB, [MSB-1] and [MSB-2] are connected to form a total [4 A−Δ] capacitor. In a lower bit (i.e., the second MSB) of the MSB, [$2^{nd}$ MSB-1] and [$2^{nd}$ MSB-2] are automatically connected to form a total 2 A capacitor. In this case, a difference between a mismatch of the MSB and a mismatch of the lower bit of the MSB becomes a total [$\Delta=\Delta_1+\Delta_2$].

In the second case Case 2, the MSBs are connected as in the table of FIG. 15. Here, the MSB becomes a total [4 A−$\Delta_2$], and the lower bit (i.e., the second MSB) of the MSB becomes a total [2 A−$\Delta_1$]. In this case, a difference between a mismatch of the MSB and a mismatch of the lower bit of the MSB becomes a total [$\Delta_2-\Delta_1$].

A result of a comparison between the first case and the second case is changed depending on [MSB-1].

This is because it has been assumed that [MSB-2] is common in forming the MSB and a mismatch is not present in [$2^{nd}$ MSB-1] and [$2^{nd}$ MSB-2].

In other words, since a difference is present between the mismatch [$\Delta=\Delta_1+\Delta_2$] of the first case and the mismatch [$\Delta_2-\Delta_1$] of the second case, an effect attributable to $\Delta_2$ is offset, with the result that there is a difference attributable to $\Delta_1$.

In the same principle, the degree of $\Delta_2$ can be aware by checking a difference between the first case and the third case Case 3.

If a capacitor mismatch is increased to a positive value as described above, a code count is increased. Accordingly, if a capacitor mismatch is increased to a negative value, a code count becomes small. In the case of FIG. 15, negative code counts are compared with each other. Accordingly, a comparison between the code counts of the three cases results in Case 1<Case 3<Case 2. As a result, a code count [Case 2−Case 1] is increased in a positive direction when $\Delta_1$ is increased, and a code count [Case 3−Case 1] is increased in a negative direction when $\Delta_2$ is increased.

Figure 16:
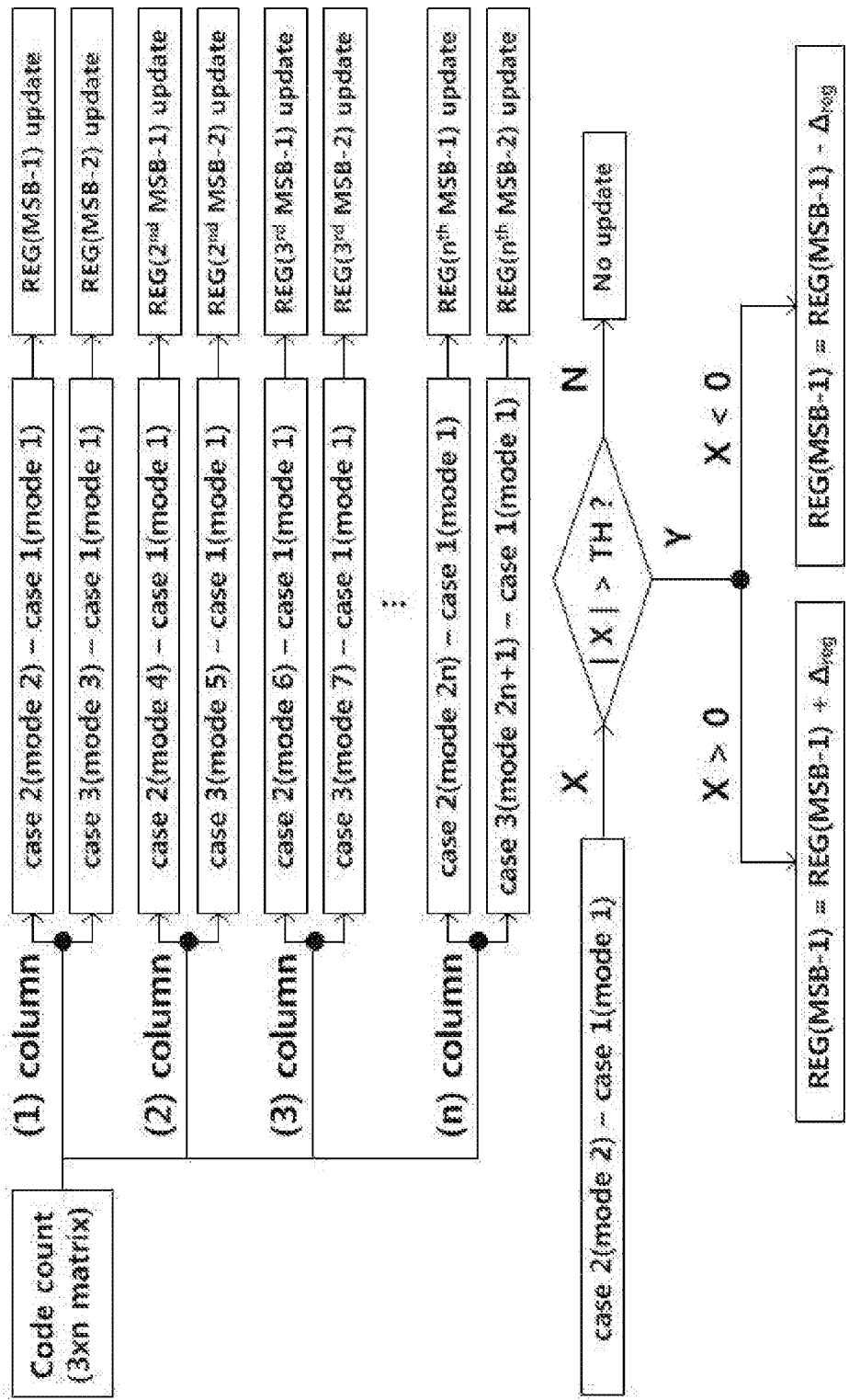
FIG. 16 is a flowchart of a register update unit 5502 in the digital background calibration apparatus using capacitor division and swapping in order to reduce a capacitor mismatch effect of the ADC according to the present invention.

FIG. 16 is a flowchart of the register update unit 5502 in accordance with the digital background calibration apparatus and method using capacitor division and swapping in order to reduce a capacitor mismatch effect of the ADC according to the present invention.

Referring to FIG. 16, a register value corresponding to each capacitor is updated depending on a difference between code counts in a specific range.

The register value ranges from an REG (MSB−1) to an REG ($N^{th}$ MBS−2).

An absolute value |X| of a code count in which an absolute value has been applied to the register value is compared with a predetermined reference value TH. If, as a result of the comparison, a compared value is found to be greater than the reference value TH, the register value is updated in accordance with the sign of a difference between code counts.

If a value of a register is a positive value, the register is increased by a minimum unit $\Delta_{reg}$ of a predetermined register.

If a value of the register is a negative value, the register is decreased by a minimum unit $\Delta_{reg}$ of the predetermined register.

As calibration is repeated, a difference between code counts gradually converges on 0(zero). The calibration is terminated when a register is no longer updated.

Figure 17:
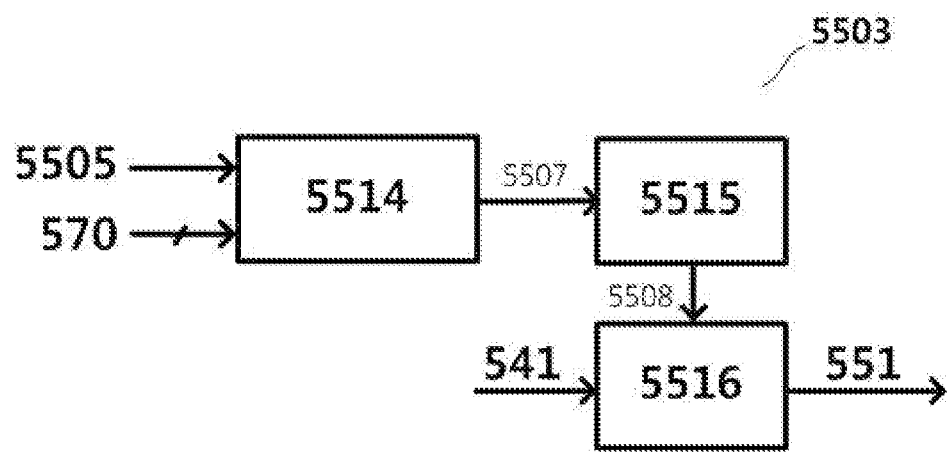
FIG. 17 shows an embodiment of an addition unit 5503 in the digital background calibration apparatus using capacitor division and swapping in order to reduce a capacitor mismatch effect of the ADC according to the present invention.

FIG. 17 shows an embodiment of the addition unit 5503 in accordance with the digital background calibration apparatus and method using capacitor division and swapping in order to reduce a capacitor mismatch effect of the ADC according to the present invention.

The final circuit in the calibration step is the addition unit 5503.

The addition unit 5503 includes a register bit-array arrangement unit 5514, a register dispersion unit 5515, and an addition and subtraction unit 5516.

The addition unit 5503 first checks that the capacitor of data Dout prior to calibration corresponds to any one of the seven types of internal swapping modes through the external control signal 570.

The register bit-array arrangement unit 5514 outputs a register bit-array arrangement unit output signal 5507 in which the register update unit output signal 5505 has been arranged on the basis of the number of bits in response to the external control signal 570.

A detailed arrangement example can be checked in the register bit-array arrangement unit 5514 of FIG. 19.

The register dispersion unit 5515 outputs a register dispersion unit output signal 5508 depending on the degree of a capacitor mismatch of the register bit-array arrangement unit output signal 5507.

Figure 18:
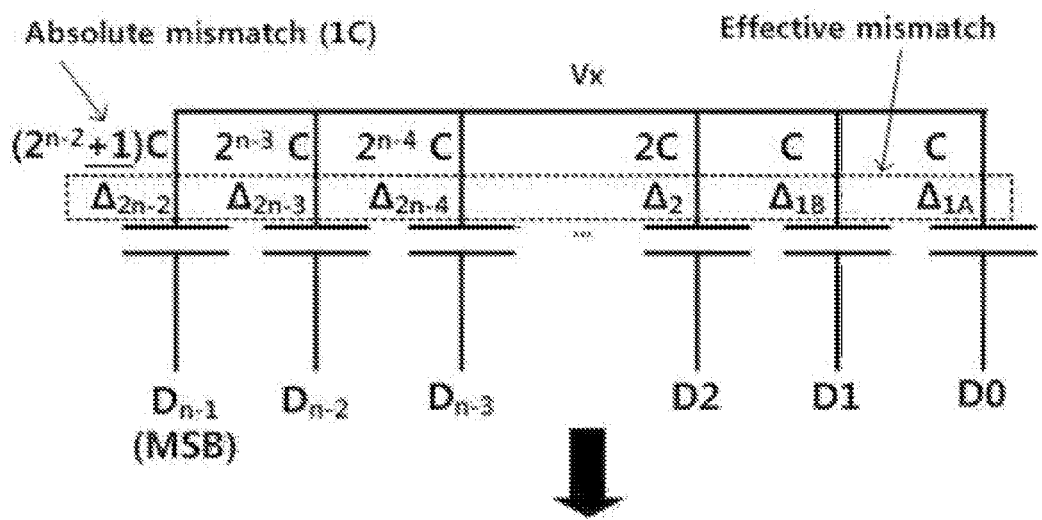
FIG. 18 is a circuit diagram showing that a mismatch effect has been dispersed in all capacitors when a mismatch is present in the DAC in the digital background calibration apparatus using capacitor division and swapping in order to reduce a capacitor mismatch effect of the ADC according to the present invention.

The reason why the register bit-array arrangement unit output signal 5507, that is, values of registers arranged on the basis of digital bits, is not directly used is shown in FIG. 18.

The addition and subtraction unit 5516 outputs the digital code calibration signal 551 using the register dispersion unit output signal 5508 and the first register signal 541.

The addition unit 5503 receives the first register signal Dout 541, that is, digital data prior to calibration, the external control signal 570, and the register update unit output signal 5505 that is a register value of each capacitor.

The operation of the addition unit 5503 is described in brief below. The addition unit 5503 arranges register values in response to the external control signal 570, properly adds values of registers to data prior to calibration, and outputs the calibrated result Dcal_out.

FIG. 18 is a circuit diagram showing that a mismatch effect has been dispersed in all capacitors when a mismatch is present in the DAC in accordance with the digital background calibration apparatus and method using capacitor division and swapping in order to reduce a capacitor mismatch effect of the ADC according to the present invention.

From FIG. 18, it can be seen that if an error is present in one capacitor, a capacitor mismatch effect is dispersed into all capacitors connected to the capacitor including the error.

A capacitor mismatch (i.e., an absolute mismatch) having capacitance of 1 C is present in the MSB of a capacitor. However, such a mismatch changes a unit capacitor. Therefore, a capacitor value of a Least Significant Bit (LSB) has a mismatch corresponding to a value obtained by subtracting an existing unit capacitor from the changed unit capacitor. The unit capacitor of each of all the capacitors is changed, and thus each of all the capacitors has a mismatch (i.e., an effective mismatch) proportional to capacitance of the capacitor. Accordingly, register values need to be dispersed and stored.

As a result, the register bit-array arrangement unit output signal 5507, that is, values of the registers of a capacitor arranged on the basis of bits, is dispersed in proportion to capacitance of the capacitor as if the degree of a capacitor mismatch of the capacitor is dispersed, so the register dispersion unit output signal 5508 is output.

FIG. 19 shows an operation table of the register dispersion unit 5515 in accordance with the digital background calibration apparatus and method using capacitor division and swapping in order to reduce a capacitor mismatch effect of the ADC according to the present invention.

Referring to FIG. 19, register values are stored according to a matrix and the sum of mismatches becomes 0 (zero). Accordingly, the sum of dispersed registers finally becomes 0 (zero).

Since a value of a register has been set to become positive if the degree of a capacitor mismatch is positive, a digital bit '1' means that calculation has been performed as a value much greater than the original weight. Accordingly, the addition and subtraction unit 5516 subtracts a value of a register from digital code. If a digital bit is '0', the addition and subtraction unit 5516 adds a corresponding register value to the digital bit.

After the addition and subtraction of a register value from the MSB to the LSB of a capacitor are completed as described above, the ADC can obtain the calibrated result Dcal_out.

Figure 20:
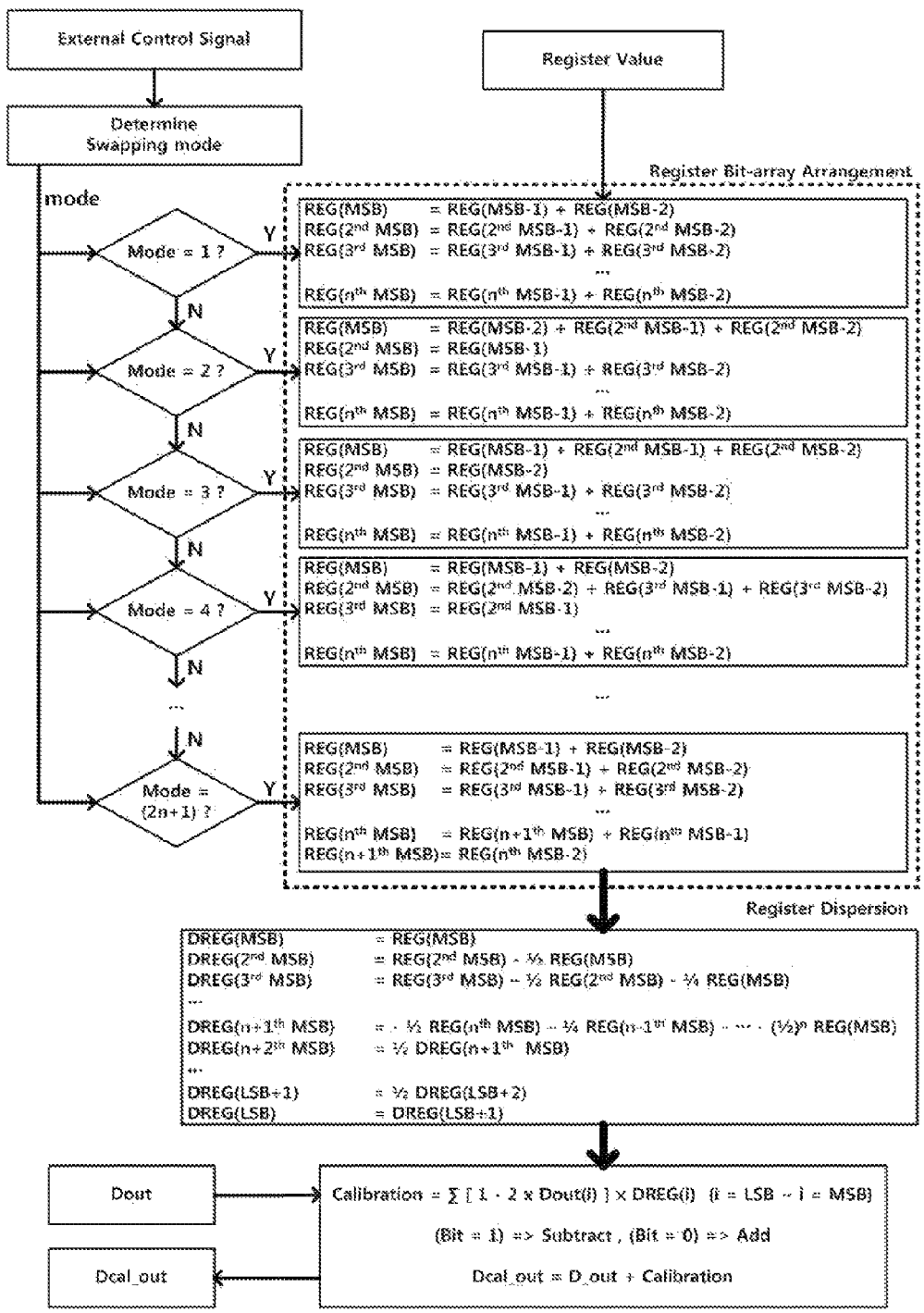
FIG. 20 is a flowchart of an addition unit 5503 in the digital background calibration apparatus using capacitor division and swapping in order to reduce a capacitor mismatch effect of the ADC according to the present invention.

FIG. 20 is a flowchart of the addition unit 5503 in accordance with the digital background calibration apparatus and method using capacitor division and swapping in order to reduce a capacitor mismatch effect of the ADC according to the present invention.

FIG. 20 shows a detailed flowchart illustrating the operation of the addition unit 5503. After register arrangement and register dispersion processes are performed, the calibrated result Dcal_out is finally obtained by adding a calibration value to a result Dout prior to calibration, that is, the first register signal.

As is apparent from the above description, the digital background calibration method and apparatus through capacitor division and swapping according to the present invention have advantages in that Differential Non-Linearity (DNL) and Integral Non-Linearity (INL) in addition to the Effective Number Of bits (SNOB) can be improved because a capacitor mismatch is reduced, with the result that a low-power high-resolution ADC can be obtained.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A digital background calibration apparatus using capacitor division and swapping in order to reduce a capacitor mismatch effect of an Analog to Digital Converter (ADC), the apparatus comprising:
    a Digital to Analog Converter (DAC) configured to select any one of an input signal, a ground voltage, and a reference voltage in response to a first control signal and a second control signal, convert the selected signal or voltage into an analog signal, and output a first conversion signal and a second conversion signal as the converted analog signal;
    a comparator configured to convert the first conversion signal and the second conversion signal into digital signals, output a first digital signal and a second digital signal as the converted digital signals, and output a third digital signal as a comparison value of the first conversion signal and the second conversion signal;
    a Successive Approximation Register (SAR) configured to output a first register signal and a second register signal using the first digital signal and the second digital signal and output the first control signal using the third digital signal;
    a calibration unit configured to output a digital code calibration signal by calibrating a mismatch value of the first register signal in response to an external control signal; and
    a bit controller configured to output the second control signal using the second register signal in response to the external control signal,
    wherein the digital code calibration signal is fed back to one side of the calibration unit, and the input signal comprises a first input signal and a second input signal.

2. The digital background calibration apparatus of claim 1, wherein the DAC comprises:
    a first capacitor unit configured to comprise a plurality of first capacitors connected in parallel;
    a second capacitor unit configured to comprise a plurality of second capacitors connected in parallel;
    a first switch unit configured to comprise a plurality of first switches for connecting any one of the reference voltage, the ground voltage, and the first input signal to the plurality of first capacitors in response to the first control signal and the second control signal;
    a second switch unit configured to comprise a plurality of second switches for connecting any one of the reference voltage, the ground voltage, and the second input signal to the plurality of second capacitors in response to the first control signal and the second control signal; and
    a third switch unit configured to have a first terminal connected to the first capacitor unit and a second terminal connected to the second capacitor unit and operate in response to the first control signal,
    wherein the first capacitor unit and the second capacitor unit have a binary-weighted capacitor array.

3. The digital background calibration apparatus of claim 2, wherein the second register signal comprises an up-bit signal, a down-bit signal, and an existing bit signal.

4. The digital background calibration apparatus of claim 3, wherein the bit controller comprises:
    a plurality of bit controllers configured to output the second control signal using the second register signal; and
    a bit control unit connected to one side of the plurality of bit controllers.

5. The digital background calibration apparatus of claim 4, wherein the bit control unit outputs a first bit control signal and a second bit control signal for controlling the plurality of bit controllers using the external control signal.

6. The digital background calibration apparatus of claim 5, wherein each of the plurality of bit controllers comprises:
    a first multiplexer configured to receive the up-bit signal and the down-bit signal and output a first multiplexer output signal in response to the first bit control signal; and
    a second multiplexer configured to receive the existing bit signal and the first multiplexer output signal and output the second control signal to the DAC in response to the second bit control signal.

7. The digital background calibration apparatus of claim 1, wherein the calibration unit comprises:
    a code count unit configured to output a code count matrix signal indicative of a degree of a capacitor mismatch of the digital code calibration signal in response to the external control signal;
    a register update unit configured to receive the code count matrix signal and output a register update unit output signal by analyzing information about a code count; and
    an addition unit configured to receive the first register signal and output a digital code calibration signal by adding a calibration value, obtained by analyzing the register update unit output signal, to the first register signal.

8. The digital background calibration apparatus of claim 7, wherein the calibration unit feeds the digital code calibration signal back to the code count unit.

9. The digital background calibration apparatus of claim 8, wherein the addition unit comprises:
    a register bit-array arrangement unit configured to output a register bit-array arrangement unit output signal, obtained by arranging the register update unit output signal based on a number of bits, in response to the external control signal;
    a register dispersion unit configured to output a register dispersion unit output signal depending on a degree of a capacitor mismatch of the register bit-array arrangement unit output signal; and
    an addition and subtraction unit configured to output the digital code calibration signal using the register dispersion unit output signal and the first register signal.

10. A digital background calibration method through capacitor division and swapping in order to reduce a capacitor mismatch effect of an ADC, the method comprising:
    using a digital to analog convertor to perform a conversion step comprising selecting one of an input signal, a ground voltage, and a reference voltage in response to a first control signal and a second control signal and outputting a plurality of analog signals as a selected signal;
    using a comparator to perform a comparison step comprising outputting a first digital signal and a second digital signal converted from the plurality of analog signals, comparing the plurality of analog signals with each other, and outputting a third digital signal as a result of the comparison;
    using a successive approximation register to perform a register step comprising outputting a first register signal and a second register signal by dispersing the first digital signal and the second digital signal into the first register signal and the second register signal and outputting the third digital signal as a first control signal in the conversion step;

using a calibration unit to perform a calibration step comprising outputting a calibrated value by calibrating a mismatch value of the first register signal in response to an external control signal and feeding back the calibrated and output value; and using a bit controller to perform a control step of comprising outputting the second register signal as the second control signal using the external control signal.

11. The digital background calibration method of claim 10, wherein the conversion step operates in a reset mode in which a DAC is reset, a sample mode in which the input signal is stored, and a hold mode in which a value stored in the sample mode is transmitted in response to the first control signal.

12. The digital background calibration method of claim 11, wherein the conversion step further comprises outputting an analog signal in response to the second control signal in the hold mode.

13. The digital background calibration method of claim 10, wherein the control step further comprises shifting the second register signal or outputting the second control signal without change in response to the external control signal.

* * * * *